United States Patent
Kang et al.

(10) Patent No.: US 9,206,032 B1
(45) Date of Patent: Dec. 8, 2015

(54) MICRO-ELECTRO-MECHANICAL SYSTEM (MEMS) CHIP

(71) Applicants: Yu-Fu Kang, Taipei (TW); Chiung-C. Lo, Miaoli (TW)

(72) Inventors: Yu-Fu Kang, Taipei (TW); Chiung-C. Lo, Miaoli (TW)

(73) Assignee: RICHTEK TECHNOLOGY CORPORATION, Chupei, Hsinchu (TW)

( * ) Notice: Subject to any disclaimer, the term of this patent is extended or adjusted under 35 U.S.C. 154(b) by 0 days.

(21) Appl. No.: 14/637,056

(22) Filed: Mar. 3, 2015

(30) Foreign Application Priority Data

Dec. 19, 2014 (TW) ............................. 103144430 A

(51) Int. Cl.
 *B81B 3/00* (2006.01)
(52) U.S. Cl.
 CPC ............ *B81B 3/0051* (2013.01); *B81B 3/0021* (2013.01); *B81B 3/0072* (2013.01); *B81B 2203/0118* (2013.01)
(58) Field of Classification Search
 CPC ............... B81B 3/0051; B81B 2203/0118; B81B 2203/0172
 See application file for complete search history.

(56) References Cited

U.S. PATENT DOCUMENTS

| | | | |
|---|---|---|---|
| 8,124,895 B2 | 2/2012 | Merassi et al. | |
| 8,661,900 B2 | 3/2014 | Merassi et al. | |
| 8,973,438 B2* | 3/2015 | Kim .................. | G01C 19/5755 73/493 |
| 2009/0194397 A1* | 8/2009 | Merassi ............... | B81B 3/0051 200/61.53 |
| 2011/0278684 A1* | 11/2011 | Kasai ..................... | G01H 11/06 257/416 |
| 2013/0068022 A1* | 3/2013 | Jeung ..................... | G01C 19/56 73/514.29 |
| 2013/0081464 A1* | 4/2013 | Park ................... | G01C 19/5783 73/504.12 |
| 2013/0106241 A1 | 5/2013 | Cazzaniga et al. | |
| 2013/0167640 A1* | 7/2013 | Lim .................... | G01P 15/0802 73/514.01 |
| 2014/0151821 A1* | 6/2014 | Liang .................. | B81B 3/0021 257/415 |

* cited by examiner

*Primary Examiner* — Lex Malsawma
(74) *Attorney, Agent, or Firm* — Tung & Associates

(57) ABSTRACT

The present invention discloses a MEMS chip which includes a device wafer and a cap wafer. The device wafer includes a first substrate and a MEMS device. The MEMS device includes a movable structure. The cap wafer includes a second substrate, an elastic structure and a stopper. The stopper is connected to the second substrate by the elastic structure. The stopper constrains a movement of the movable structure, and when the movable structure contacts the stopper, the elastic structure provides a resilience force to the stopper.

5 Claims, 6 Drawing Sheets

MICRO-ELECTRO-MECHANICAL SYSTEM (MEMS) CHIP

CROSS REFERENCE

The present invention claims priority to TW 103144430, filed on Dec. 19, 2014.

BACKGROUND OF THE INVENTION

1. Field of Invention

The present invention relates to a Micro-Electro-Mechanical System (MEMS) chip; particularly, it relates to such a MEMS chip having a stopper which constrains the displacement of a movable structure of the MEMS chip by a resilience force, such that the movable structure of the MEMS chip is not damaged by an undesired collision, so as to enhance the robustness of the MEMS chip.

2. Description of Related Art

Please refer to FIG. 1, which shows a schematic diagram of a conventional MEMS chip. The conventional MEMS chip 1 includes a cap wafer 10 and a substrate 3. A movable structure 2 is connected to the substrate 3 via a fixing part 6 and an anchor 7.

In the conventional MEMS chip 1 which is for example a micro-acoustical sensor, gyro-sensor, or accelerometer, etc., the internal movable structure 2 is often required to be sealed in a sealed space. When the movable structure 2 moves relatively to the substrate 3 along a direction S', to prevent the movable structure 2 from directly collide to the cap wafer 10, a stopper 12 is often required to limit the movements of the movable structure 2. The unwanted collision of the movable structure 2 may generate particles which cause the internal pressure in the sealed space to be inaccurate, or may even cause a serious damage of the movable structure 2. In such prior art, the stopper 12 is formed during the manufacturing process as a downward projecting portion of the cap wafer 10, extending from a lower surface 10a of the cap wafer 10 toward the movable structure 2, as shown in FIG. 1. The stopper 12 has two lateral bevels 121 which overlap with the movable structure 2 (as illustrated by the dotted line in FIG. 1). The lateral bevels 121 helps to prevent the movable structure 2 from directly collide to the cap wafer 10.

However, when the movable structure 2 moves relatively to the substrate 3 along the direction S', if a force F1' exerted from the movable structure 2 to the stopper 12 is too strong, the movable structure 2 or the stopper 12 will still be damaged by the collision to cause the above-mentioned problems.

For relevant details, one can refer to U.S. Pat. No. 8,661,900, U.S. Pat. No. 8,124,895 and U.S. Patent Publication No. 2013/0106241.

In view of the above, to overcome the drawbacks in the prior art, the present invention proposes a MEMS chip having a stopper which constrains the displacement of a movable structure of the MEMS chip by a resilience force, such that the movable structure of the MEMS chip is not damaged by an undesired collision, so as to enhance the robustness of the MEMS chip.

SUMMARY OF THE INVENTION

From one perspective, the present invention provides a MEMS chip, comprising: a device wafer, including: a first substrate; and a MEMS device on or above the first substrate, wherein the MEMS device includes a movable structure; and a cap wafer, which is bonded with the device wafer to form a chamber in between, the cap wafer including: a second substrate, wherein the second substrate has a first lower surface facing the movable structure; an elastic structure connected to the first lower surface of the second substrate; and a stopper connected to the first lower surface of the second substrate via the elastic structure, wherein the stopper has a second lower surface which is apart from the movable structure by a first distance, whereby the stopper constrains a movement of the movable structure along a first direction, and when the movable structure contacts the stopper, the elastic structure provides a resilience force to the stopper along a second direction which is opposite to the first direction, wherein the first direction is a direction which shortens the first distance.

In one embodiment, the elastic structure includes an elastic member.

In one embodiment, the stopper and at least a part of the elastic member are integrated to form a cantilever.

In one embodiment, the elastic structure includes an elastic member and a fixing member, the fixing member being connected to the first lower surface of the second substrate, and the elastic member being connected between the fixing member and the stopper.

In one embodiment, the stopper and the elastic member are integrated to form a cantilever.

The objectives, technical details, features, and effects of the present invention will be better understood with regard to the detailed description of the embodiments below, with reference to the attached drawings.

DESCRIPTION OF THE PREFERRED EMBODIMENTS

The above and other technical details, features and effects of the present invention will be will be better understood with regard to the detailed description of the embodiments below, with reference to the drawings. The drawings as referred to throughout the description of the present invention are for illustration only, to show the interrelations between the components, but not drawn according to actual scale.

Figure 1:
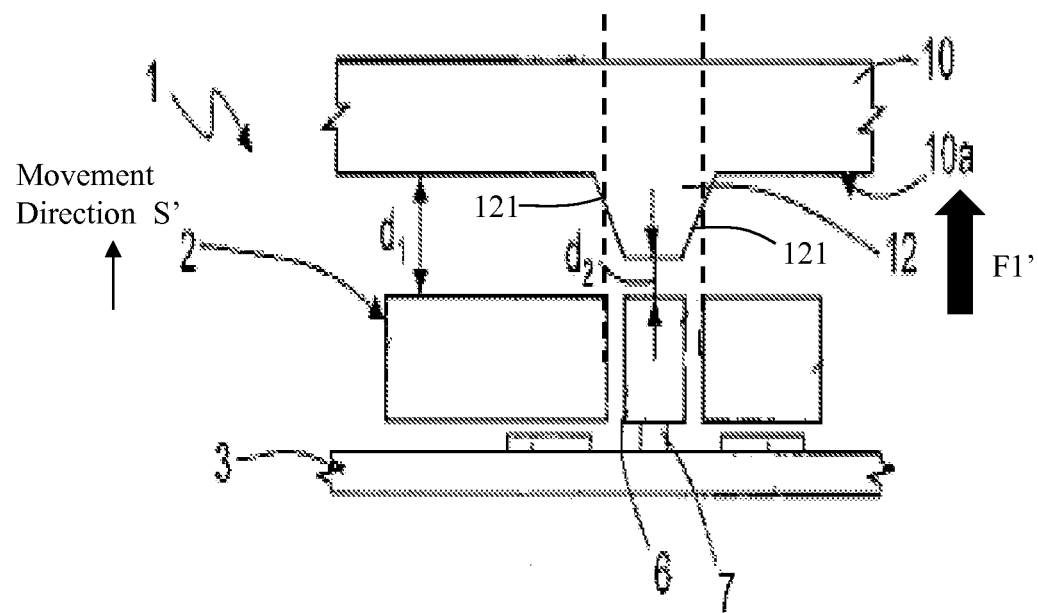
FIG. 1 shows a schematic diagram of a conventional MEMS chip.
Figure 2:
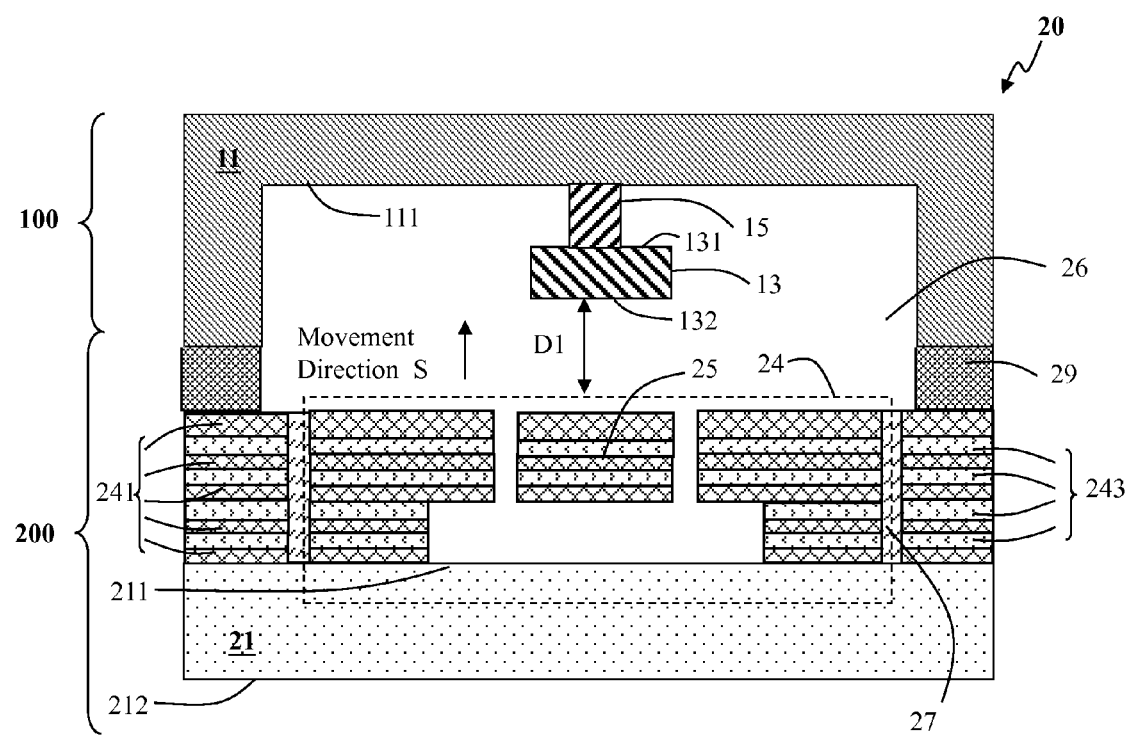
FIG. 2 shows a schematic diagram of a MEMS chip according to an embodiment of the present invention.

Please refer to FIG. 2, which shows a schematic diagram of a MEMS chip according to an embodiment of the present invention. The MEMS chip 20 includes a cap wafer 100 and a device wafer 200 bonded to each other, and a chamber 26 is formed between the cap wafer 100 and the device wafer 200. (The cap wafer 100 and the device wafer 200 are bonded to each other as wafers and subsequently sliced to form the MEMS chip 20. Therefore, from the perspective of the sliced chip, the cap wafer 100 and the device wafer 200 are no longer complete wafers. However, as customary in this technical field, the cap wafer 100 and the device wafer 200 are still called "wafers". From the perspective of the sliced chip, the cap wafer 100 can be regarded as a cap layer and the device wafer 200 can be regarded as a composite device layer.) The cap wafer 100 and the device wafer 200 can be bonded to each other via any known bonding process. In one embodiment, a boding layer 29 can be provided between the cap wafer 100 and the device wafer 200 to bond the cap wafer 100 and the device wafer 200 by glass frit or solder. For example, the bonding layer 29 can be made of a material such as but not limited to: metal, aluminum-silicon alloy, silicon-gold alloy, tin-silver alloy, gold-germanium alloy, gold-tin alloy, or lead-tin alloy.

The device wafer 200 includes a substrate 21 and a MEMS device 24 on or above the substrate 21. The substrate 21 can be for example but not limited to a silicon substrate, and the substrate 21 has a first surface 211 and a second surface 212 opposite to the first surface 211. The MEMS device 24 is on or above the first surface 211 of the substrate 21. In addition to the MEMS device 24, the device wafer 200 can further include, for example but not limited to, a microelectronic circuit, such as a complementary metal-oxide-semiconductor (CMOS) transistor circuit or a bipolar junction transistor (BJT) circuit. As shown in FIG. 2, the MEMS device 24 can be made by, for example but not limited to, a standard CMOS manufacturing process. In such standard CMOS manufacturing process, for example, the metal layers 241 and the via layers 243 are used to form the MEMS device 24 and a movable structure 25 included in the MEMS device 24, and the insulating layers 27 are used to electrically isolate the MEMS device 24 from other parts. Note that FIG. 2 is for illustration only, but not for limiting the scope of the present invention; the structure, material and layout can be modified.

The MEMS device 24 includes a movable structure 25. The movement of the movable structure 25 causes a change of a capacitance, so that the MEMS chip 20 can sense the acceleration, gravity or pressure, depending on the design purpose of the MEMS chip 20. Regardless of the design purpose, during the operation of the MEMS chip 20, it is possible that the movable structure 25 will move relatively to the cap wafer 100, along a direction S.

The cap wafer 100 includes a substrate 11. The substrate 11 can be for example but not limited to a silicon substrate, and the substrate 11 has a lower surface 111. After the cap wafer 100 and the device wafer 200 are bonded, the lower surface 111 of the substrate 11 faces the MEMS device 24. A space formed between the lower surface 111 of the substrate 11 and the device wafer 200 is the chamber 26.

As compared to the conventional MEMS chip 1, the MEMS chip 20 of this embodiment further includes an elastic structure 15 and a stopper 13. The stopper 13 is connected to the lower surface 111 of the substrate 11 via the elastic structure 15. The lower surface 132 of the stopper 13 is apart from an upper surface of the movable structure 25 by a distance D1.

In this embodiment, in the chamber 26, the stopper 13 and the movable structure 25 of the MEMS device 24 at least partially overlap with each other, as viewed from the direction S. Thus, the stopper 13 can constrain the movement of the movable structure 25 of the MEMS device 24 along the direction S in the chamber 26 (the details as to how the stopper 13 constrain the displacement of the movable structure 25 will be described later).

Figure 3A:
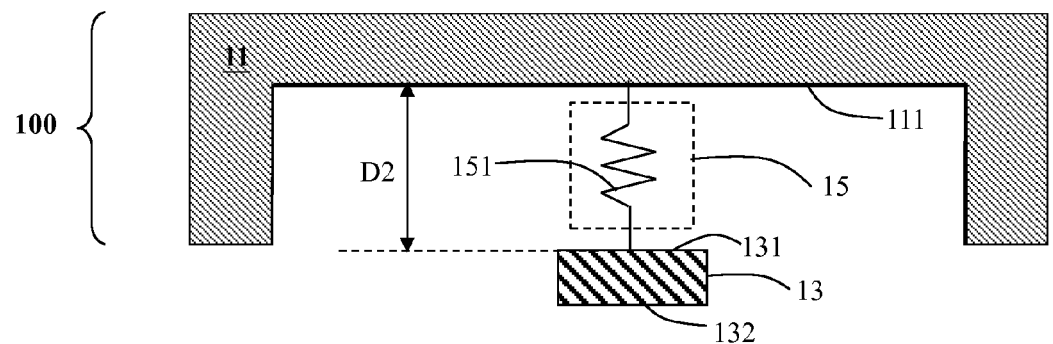
FIG. 3A shows an embodiment of an elastic structure of the present invention.
Figure 3B:
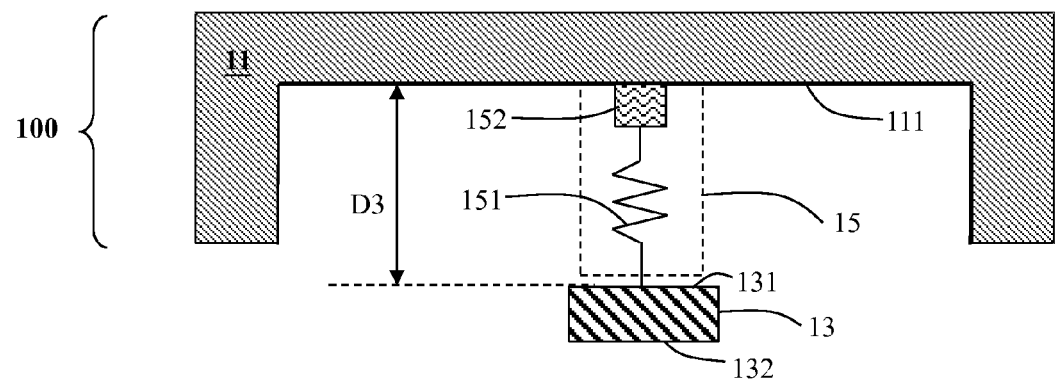
FIG. 3B shows another embodiment of an elastic structure of the present invention.

Please refer to FIGS. 3A and 3B. FIG. 3A shows an embodiment of an elastic structure of the present invention. FIG. 3B shows another embodiment of an elastic structure of the present invention. As shown in FIG. 3A, in one embodiment, the elastic structure 15 of the present invention can be formed by an elastic member 151. The stopper 13 is connected to the lower surface 111 of the substrate 11 via the elastic structure 15. In this case, the upper surface 131 of the stopper 13 is apart from the lower surface 111 of the substrate 11 by a distance D2. Or, as shown in FIG. 3B, in another embodiment, the elastic structure 15 of the present invention can include an elastic member 151 and a fixing member 152. The fixing member 152 is connected to the lower surface 111 of the substrate 11. The elastic member 151 is connected between the fixing member 152 and the stopper 13. That is, the elastic member 151 is connected to the lower surface 111 of the substrate 11 by the fixing member 152. In this case, the upper surface 131 of the stopper 13 is apart from the lower surface 111 of the substrate 11 by a distance D3. The actual length of distances D1, D2 and D3 can be designed depending on practical needs. Note that the lower surface 111 of the substrate 11, the upper surface 131 and the lower surface 132 of the stopper 13, and the upper surface of the movable structure 25 are not limited to a flat surface. When the surfaces are not flat surfaces, the values of the above-mentioned distances D1, D2 and D3 may vary if the measurement is taken from different positions, which, certainly, do not affect the present invention.

Figure 3C:
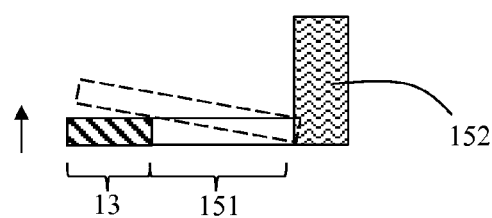
FIG. 3C shows an embodiment as to how the stopper and the elastic member of the present invention are integrated to form a cantilever.

Also note that the elastic member 151 is symbolically illustrated here as a spring for illustration purpose only. The elastic member 151 is not necessarily a spring and it needs not have a shape of a spring. The elastic member 151 is simply required to provide a buffer function between the stopper 13 and the cap wafer 100. For example, please refer to FIG. 3C; in one embodiment, the stopper 13 and the elastic member 151 are integrated to become a cantilever. Or, from another perspective, the stopper 13 and the elastic member 151 are two components of a cantilever. When the cantilever receives a force from the direction as shown by the arrow in FIG. 3C, the cantilever will be pushed upward temporarily (as shown by the dotted line in FIG. 3C), and a resilience force opposite to the arrow direction in FIG. 3C will be generated. Also note that, in FIG. 3C, if the fixing member 152 itself is elastic, the elastic member 151 and the fixing member 152 can be viewed as one single piece, or the fixing member 152 can be viewed as a part of the elastic member 151, and under such circumstance, the structure corresponds to the embodiment in FIG. 3A.

The elastic member 151 is preferably made of a high-elasticity material, or the shape of the elastic member 151 is designed in a way that the elastic member 151 can provide a buffer function as described in the above. In one embodiment, the elastic member 151 can be made of metal, such as aluminum, copper, tungsten or silver. In another embodiment, the elastic member 151 can be made of a polymer.

The details as to how the stopper 13 constrains the movement of the movable structure 25 of the MEMS device 24 in the chamber 26 along the direction S are explained below, with reference to FIGS. 4A and 4B.

Figure 4A:
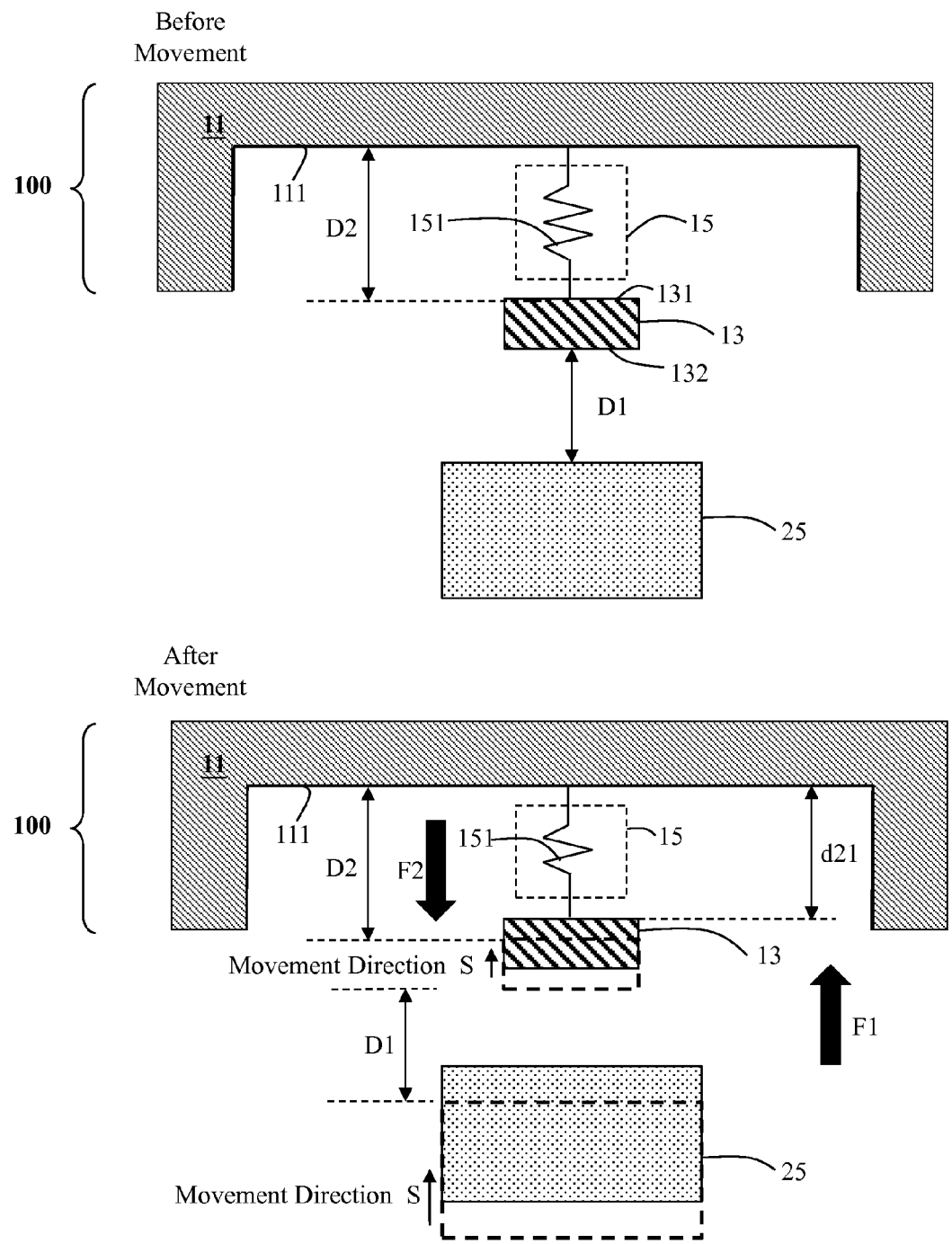
FIG. 4A shows an embodiment as to how the stopper of the present invention constrains the movement of the movable structure along a movement direction.

Please refer to FIG. 4A. As shown in the upper part of FIG. 4A, before the movable structure 25 moves along the direction S (i.e., before the movable structure 25 contacts the stopper 13 due to the displacement of the movable structure 25), the distance between the upper surface 131 of the stopper 13 and the lower surface 111 of the substrate 11 is D2. As the movable structure 25 moves along the direction S (the movable structure 25 is not limited to moving only along the direction S; it may move along other directions and the movement has a component along the direction S), as shown in the lower part of FIG. 4A, the distance between the movable structure 25 and the stopper 13 gradually decreases, and eventually the movable structure 25 contacts the stopper 13. When the movable structure 25 collides to the stopper 13, the distance between the stopper 13 and the cap wafer 100 changes from the distance D2 to the distance d21, wherein the distance d21 is shorter than the distance D2 (as described above, the upper surface 131 of the stopper 13 is not limited to a flat surface. Moreover, the collision will not necessarily cause the whole upper surface 131 of the stopper 13 to move upward evenly. Hence, that "the distance changes from the distance D2 to the distance d21" needs not be true at every position of the upper surface 131 of the stopper 13, but it is only required to be true at at least one position).

When the movable structure 25 contacts the stopper 13, the movable structure 25 exerts a force F1 onto the stopper 13. At the same time, the elastic member 151 will generate a corresponding resilience force F2. In one embodiment, the force F1 and the resilience force F2 are parallel with the direction S (wherein the direction S is for example but not limited to parallel with the Z axis). The direction of the force F1 and the direction of the resilience force F2 are opposite to each other.

As a consequence, the resilience force F2 generated by the elastic member 151, which is opposite to the force F1, pushes the movable structure 25 toward a direction opposite to the direction S, thereby reducing the impact of the force F1 on the stopper 13. Consequently, the stopper 13 can constrain the movement of the movable structure 25 along the direction S, thereby preventing the movable structure 25 of the MEMS device 24 from being damaged by unwanted collisions, so as to enhance the robustness of the MEMS device 24. As described above, in the prior art, even though the collision does not cause any damage to the mechanical structure, particles can fall off to affect the pressure of the chamber 26. The present invention can reduce the impact caused by the collision, thereby enhancing the robustness of the MEMS chip 20.

Figure 4B:
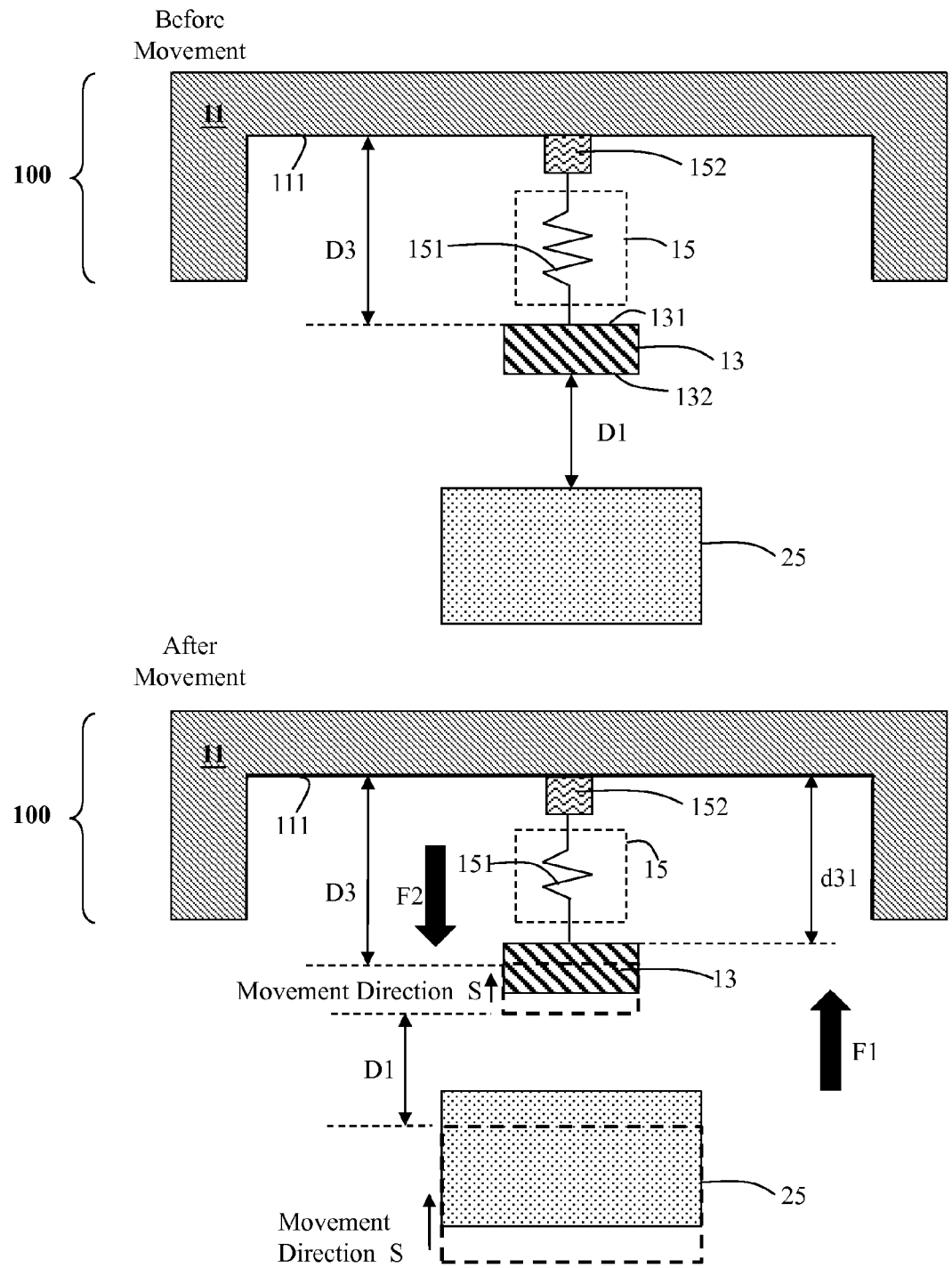
FIG. 4B shows another embodiment as to how the stopper of the present invention constrains the movement of the movable structure along a movement direction.

Next, please refer to FIG. 4B, which shows another embodiment as to how the stopper of the present invention constrains the movement of the movable structure. This embodiment is similar to the embodiment of FIG. 4A, but is different in that: first, the elastic structure 15 of this embodiment includes an elastic member 151 and a fixing member 152, while the elastic structure 15 of the embodiment of FIG. 4A only includes an elastic member 151. Second, in this embodiment, when the movable structure 25 collides to the stopper 13, the distance between the stopper 13 and the cap wafer 100 correspondingly becomes smaller, for example from the distance D3 to the distance d31, wherein the distance d31 is shorter than the distance D3, while in the embodiment of FIG. 4A, the distance between the stopper 13 and the cap wafer 100 changes from the distance D2 to the distance d21. Besides the above differences, this embodiment operates according to substantially the same mechanism as the embodiment of FIG. 4A, and have substantially the same advantages and efficacies as the embodiment of FIG. 4A, which are not redundantly repeated here.

Figure 5:
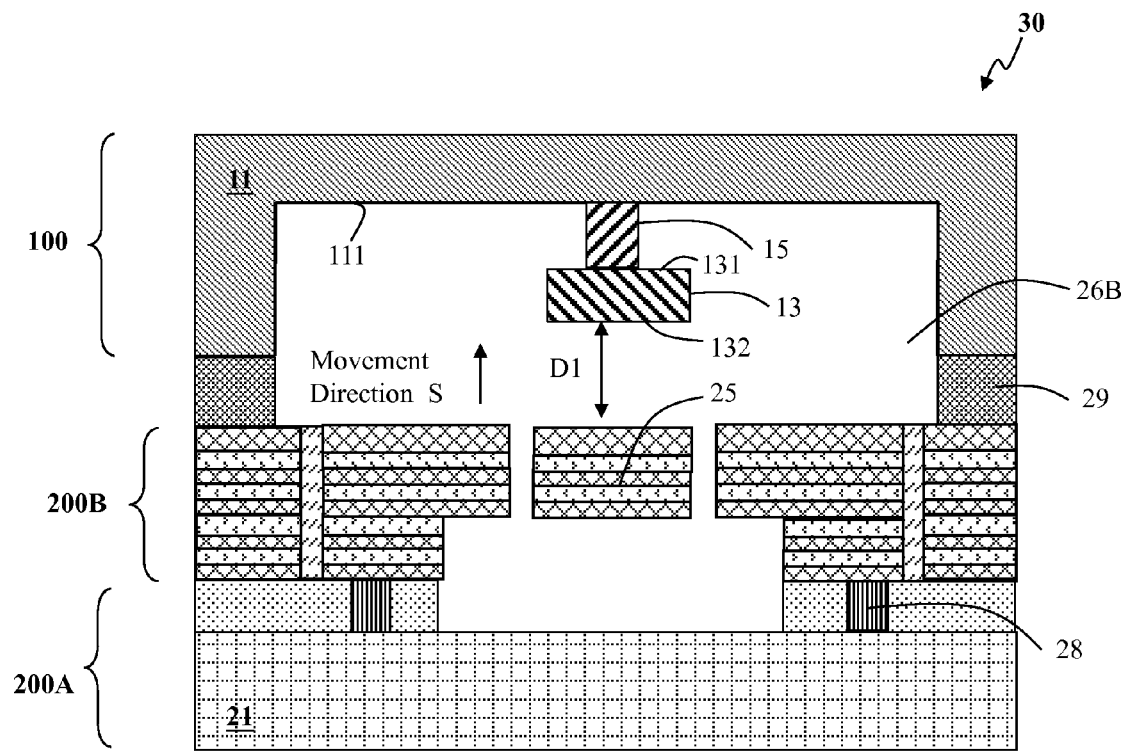
FIG. 5 shows a schematic diagram of a MEMS chip according to another embodiment of the present invention.

Please refer to FIG. 5, which shows a schematic diagram of a MEMS chip according to another embodiment of the present invention.

The MEMS chip 30 of this embodiment is substantially the same as the MEMS chip 20 of the above-mentioned embodiment, but is different in that: the manufacturing process of the device wafer 200 in this embodiment is different from that of the above-mentioned embodiment. In this embodiment, the device wafer 200 is formed by bonding a CMOS wafer 200A to a MEMS wafer 200B. In the MEMS wafer 200B, the configuration of the MEMS device 24 has been defined. The CMOS wafer 200A includes a substrate 21 (e.g., silicon substrate) and a microelectronic circuit (not shown) manufactured via a standard CMOS process. In this embodiment, because it is required to electronically connect the microelectronic circuit of the CMOS wafer 200A to the MEMS device 24 of the MEMS wafer 200B, plural conducting plugs 28 are preferably provided. The CMOS wafer 200A is bonded to the MEMS wafer 200B in a way that the conducting plugs 28 electrically connect the MEMS device 24 and the microelectronic circuit, to form the device wafer 200. In this embodiment, the bonding layer 29 can be an adhesive layer provided to bond the cap wafer 100 with the device wafer 200.

The MEMS chip 30 of this embodiment operates according to substantially the same mechanism as the MEMS chip 20 of the above-mentioned embodiment, so they have substantially the same advantages and efficacies, which are not redundantly repeated here.

The present invention is superior to the prior art because the resilience force F2 generated by the elastic member 151, which is opposite to the force F1, pushes the movable structure 25 toward a direction opposite to the direction S, thereby reducing the impact of the force F1 on the stopper 13. Consequently, the stopper 13 can constrain the movement of the movable structure 25 along the direction S, thereby preventing the movable structure 25 or the cap wafer 100 from being damaged by unwanted collisions, so as to enhance the robustness of the MEMS chip 20.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. In view of the foregoing, the spirit of the present invention should cover all such and other modifications and variations, which should be interpreted to fall within the scope of the following claims and their equivalents.

What is claimed is:

1. A micro-electron-mechanical system (MEMS) chip, comprising:
   a device wafer, including:
      a first substrate; and
      a MEMS device on or above the first substrate, wherein the MEMS device includes a movable structure; and
   a cap wafer, which is bonded with the device wafer to form a chamber in between, the cap wafer including:
      a second substrate, wherein the second substrate has a first lower surface facing the movable structure;
      an elastic structure connected to the first lower surface of the second substrate; and
      a stopper connected to the first lower surface of the second substrate via the elastic structure, wherein the stopper has a second lower surface which is apart from the movable structure by a first distance,
      whereby the stopper constrains a movement of the movable structure along a first direction, and when the movable structure contacts the stopper, the elastic structure provides a resilience force to the stopper along a second direction which is opposite to the first direction, wherein the first direction is a direction which shortens the first distance.

2. The MEMS chip of claim 1, wherein the elastic structure includes an elastic member.

3. The MEMS chip of claim 2, wherein the stopper and at least a part of the elastic member are integrated to form a cantilever.

4. The MEMS chip of claim 1, wherein the elastic structure includes an elastic member and a fixing member, the fixing member being connected to the first lower surface of the second substrate, and the elastic member being connected between the fixing member and the stopper.

5. The MEMS chip of claim 4, wherein the stopper and the elastic member are integrated to form a cantilever.

\* \* \* \* \*